United States Patent [19]

Eshraghian et al.

[11] Patent Number: 5,500,522
[45] Date of Patent: Mar. 19, 1996

[54] GALLIUM ARSENIDE MESFET IMAGER

[75] Inventors: Kamran Eshraghian, Panorama; Derek Abbott, Magill, both of Australia

[73] Assignee: Luminis Pty. Limited, Adelaide, Australia

[21] Appl. No.: 211,373
[22] PCT Filed: Sep. 25, 1992
[86] PCT No.: PCT/AU92/00524
§ 371 Date: May 27, 1994
§ 102(e) Date: May 27, 1994
[87] PCT Pub. No.: WO93/07643
PCT Pub. Date: Apr. 15, 1993

[30] Foreign Application Priority Data

Sep. 30, 1991 [AU] Australia ................ PK8660

[51] Int. Cl.$^6$ ................................ H01L 27/146
[52] U.S. Cl. ........................ 250/208.1; 257/292
[58] Field of Search .............. 250/208.1, 214.1, 250/214 R, 208.2; 257/225, 228, 230, 290, 291, 292, 293, 431, 444, 445, 449, 257, 258

[56] References Cited

U.S. PATENT DOCUMENTS

| | | | |
|---|---|---|---|
| 4,772,931 | 9/1988 | Rogers. | |
| 4,933,731 | 6/1990 | Kimura | 257/292 |
| 5,034,794 | 7/1991 | Murotani | 257/258 |
| 5,120,664 | 6/1992 | Murotani | 437/2 |

FOREIGN PATENT DOCUMENTS

| | | |
|---|---|---|
| 252414 | 1/1988 | European Pat. Off. . |
| WO91/14283 | 9/1991 | WIPO . |
| WO92/02959 | 2/1992 | WIPO . |

OTHER PUBLICATIONS

Applied Physics Letters, vol. 52, No. 12, issued 21 Mar. 1988.
W. C. Koscielniak, R. M. Kolbas, M. A. Littlejohn and B. W. Licznershi, "Photocurrent enhancement in a GaAs metal--semiconductor-metal-semiconductor-metal photodetector due to ultrasmall Au islands", pp. 987–989.
Soviet Physics Semiconductors, vol. 21, No. 6, Jun. 1987, "Electrical and photoelectric properties of N+–n°–N+ structures made of GaAs with a metal grating in the N°-type region", pp. 601–602.

*Primary Examiner*—Edward P. Westin
*Assistant Examiner*—John R. Lee
*Attorney, Agent, or Firm*—Quarles & Brady

[57] ABSTRACT

A pixel comprises a Field Effect Transistor formed on a gallium arsenide substrate wherein a source (1) of the field effect transistor is a photoresponsive element, a gate of the field effect transistor is shielded from light and acts as a switch to enable/disable readout and a drain (4) of the field effect transistor is connected to a readout line. Also disclosed an X-Y imager formed on a gallium arsenide substrate from a plurality of pixels and a processing area wherein each pixel comprises a photoresponsive source (1), a gate formed from a plurality of metal fingers (7) across the source (1), a drain (4) connected to a readout line and a gate resistor (12) connected in series with the fingers (7). The arrangement of fingers (7) across the source (1) in co-operation with the gate resistor (12) produces an enhanced optical gain.

23 Claims, 7 Drawing Sheets

GALLIUM ARSENIDE MESFET IMAGER

FIELD OF THE INVENTION

This invention relates to a photoresponsive device based on Gallium Arsenide (GaAs) Integrated Circuit (IC) MESFET technology. In particular it relates to a Gallium Arsenide MESFET imager. Elements of the invention may also be implemented utilizing GaAs JFET technology.

BACKGROUND OF THE INVENTION

Gallium Arsenide (GaAs) has been recognized as being very useful as the semiconductor base for very high speed VLSI circuits. The use of GaAs in integrated circuits has a number of advantages over conventional silicon technology. These include: High substrate bulk resistivity providing isolation and minimizes parasitic capacitance; Increased speed; Increased temperature tolerance; reduced power dissipation; and Improved radiation hardness.

GaAs is also useful as a photodetector and it has been known to produce photodetectors from GaAs which are analogous to existing silicon photodiodes.

Solid state imagers utilizing silicon technology are well known. Two kinds of imagers exist at the present time, these am charge coupled devices (CCD) and XY arrays. XY array is a generic term which includes charge injection devices (CID), mosaic arrays, transistor arrays and others. The charge coupled device is a somewhat esoteric and expensive imager, but offers good resolution. This technology is currently expanding the video camera market. The second type of imager is the XY array which consists of a matrix of transistors that can be addressed either by decoders or shift registers. It is simpler and cheaper but has lower resolution. It finds application in the industrial market where cosmetic image quality is not so important.

Although some attempts have been made to produce CCDs utilizing GaAs technology these are at an early stage. Due to the complicated nature of CCD devices and the cost of producing such a device, this technology is still formative. Also CCDs are more sensitive to defects than XY arrays and due to the higher defect density in GaAs, XY arrays offer some advantage.

Attempts have not been made to develop an XY imager based upon Gallium Arsenide. There are a number of reasons for this based upon perceived limitations of GaAs technology. Firstly, research has concentrated on the high speed processing aspects of GaAs MESFET IC technology whereas an XY imager is a low frequency device that, at first sight, would seem to be inappropriate for utilizing high speed technology. Secondly, it would seem that the lower doping of the GaAs substrate compared to silicon would result in a longer carrier diffusion path leading to increased crosstalk between imager pixels. Experiments performed by the inventors has proved that this is not the case. Thirdly, it was considered that the small voltage levels in GaAs would lead to a poor signal-to-noise ratio. However, this problem is not fundamental and the inventors have found that it can be overcome by an appropriate approach to circuit design. Furthermore, the inventors have recognized the advantage that GaAs ICe have a lower wiring capacitance than equivalent silicon devices, this leads to a lower kTC noise at the output and therefore a better than expected signal-to-noise ratio.

It is an intended object of this invention to provide a photoresponsive device based on standard Gallium Arsenide IC technology so that the imager can be integrated on the same substrate as the high speed digital processing elements. It is a further intended object to at least provide the public with a useful alternative to existing silicon devices.

An imaging device utilizing a GaAs digital IC process has the advantage that both the photoresponsive elements and the processing circuitry can be formed on the same substrate using very large scale integration (VLSi) techniques. This offers the opportunity of utilizing the high speed characteristics of GaAs for signal processing and the optical characteristics for imaging. This leads to cheaper and more compact imaging systems.

The inventors have also discovered that the optical gain of a GaAs MESFET sharply increases in the region where the gate crosses the transistor edge. This effect only occurs with a series gate resistor inserted, to produce the conditions for photovoltaic gate biasing. This effect occurs when the gate photocurrent follows through an external series gate resistor, $R_g$, thus increasing the gate voltage and hence drain current. To produce a significant increase in drain current, a large $R_g$ introduces a large RC time constant which typically causes the response to roll-off in the 10–100 MHz range.

This edge effect is observed in a planar GaAs MESFET and is quite different to the edge gain effect observed in mesa GaAs MESFET structures. Photocollection under the gate overhang, outside the transistor, is suggested to explain the gain effect, in the planar device.

This new optical edge gain effect in planar GaAs MESFETs is useful in low frequency applications, such as in an imager. Thus a further object of this invention is to provide a GaAs optical imager utilizing this discovery.

SUMMARY OF THE INVENTION

Therefore, according to one form of this invention there is proposed a GaAs image sensor, said sensor being fabricated in a conventional GaAs digital IC process and including a GaAs photoresponsive array and a GaAs image processor, thereby permitting very large scale integration.

In a further form of this invention, although again not necessarily the only or indeed the broadest form, there is proposed a pixel comprised of a MESFET formed on a gallium arsenide substrate in which the source is a photoresponsive element, the gate of the MESFET is shielded from light and acts as a switch to enable/disable readout and the drain is connected to a readout line.

The photoresponsive element results from photocollection in the source/substrate depletion region. In essence the source is equivalent to a photodiode and the equivalent circuit within the pixel can be considered as a standard FET with a photodiode connected in series with the source.

In preference the pixel size is approximately 40 μm by 40 μm. Most of the area of each pixel is taken up by the photoactive source of the MESFET. The rest of the pixel contains an address line which is connected to the gate and a data line which is connected to the drain.

In a still further form of this invention, there is proposed a pixel comprised of a MESFET formed on a gallium arsenide substrate in which the source is a photoresponsive element, the gate of the MESFET is shielded from light and acts as a switch to enable/disable readout, the drain is connected to a readout line and there are a plurality of metal fingers across the source, each finger extending beyond the source, said source accumulating charge when exposed to light.

In preference the plurality of metal fingers lie across the source regions thereby forming a Schottky diode, said metal fingers being made from the same material as the MESFET gate. Both the depletion regions at the Schottky interface and substrate interface contribute towards photocollection in this instance, and can be considered as two photodiodes in parallel. As the material is opaque, the fingered structure is designed to maximize the amount of depletion region that is exposed to photogenerated charge.

Most of the area of each pixel is taken up by the photoactive fingered structure. The rest of the pixel contains an address line which is connected to the gate and an anti-blooming line which is connected to the metal fingers.

In preference the size of each finger is approximately 0.8 μm by 40 μm. In preference there are between 30 and 50 fingers per pixel, however this number depends on the size of each finger and the size of each pixel. Technological improvements are expected to result in a reduction of all sizes and corresponding changes in the number of fingers per pixel.

In preference the pixels are connected at one end by an anti-blooming bias line. This feature is possible due to the fact that the fingered Schottky diode can go forward biassed if blooming (i.e. optical overload) occurs. The insulated gates in a MOS silicon XY array do not allow this facility.

When blooming occurs and the Schottky diodes go forward biassed, a quantity of excess charge, depending on the voltage bias applied to the antiblooming line, is diverted to the anti-blooming line rather than generating unwanted pixel crosstalk through the substrate.

Transparent Schottky diodes may be utilized and photocollection and storage would be via the gate region. Transparent Schottky contacts may be formed from transparent material such as sufficiently thin gold. In the case of transparent material the fingered structure would be replaced by a continuum.

In yet another form of the invention the metal fingers and active area are laid out to maximize the number of locations where the fingers cross the transistor boundary, said fingers forming the gate of a photoactive transistor, the source of the photoactive transistor is grounded and there is a readout transistor in series with the photoactive transistor.

The locations where the fingers cross the transistor boundary will be referred to as edges.

In this form the invention is topographically the same as the previous form but with an additional ground contact and a segmented layout of the active area to maximize the number of edges.

In preference there is a gate resistor connected in series with the gate of the photoactive transistor. The gate resistor has a value between 1 MΩ and 10 MΩ approximately. These resistors may be implanted into the GaAs substrate but in preference are printed on a transparent substrate (e.g. glass) and then hybridized onto the imager. The advantage is that these resistors may be laser trimmed to correct for any fixed-pattern-noise (FPN) that the edge effect produces. In preference the resistors are biased via transparent conductors such as Indium Tin Oxide (ITO).

The hybridization between the transparent substrate and the imager may either be done by utilizing methods such as bump bonding or via holes.

In a still further form, the invention can be said to reside in an X-Y imager formed on a GaAs substrate in which there is a photoactive area consisting of a plurality of pixels, each pixel comprising a MESFET formed on a gallium arsenide substrate in which the source of the MESFET is a photoresponsive element, the gate of the MESFET is shielded from light and acts as a switch to enable/disable readout and the drain is connected to a readout line and in which image processing is conducted in a processing area comprised of a plurality of integrated circuits.

In another form of the invention there is provided a plurality of metal fingers across the source, each finger extending beyond the source, said source accumulating charge when exposed to light.

In yet another form the metal fingers are laid out to maximize the number of edges.

In preference the pixels are addressable by a circuit which uses one shift register or decoder to address a series of paths that control the pixel enable/disable gates and a second shift register or decoder is used to address a multiplexer that converts parallel data obtained from the readout lines into a serial stream.

In preference a charge sensing technique is adopted for image readout in which charge is transferred from a pixel to a readout line and from readout line to an output bus by a process of capacitive charge sharing. Alternatively, a voltage sensing technique can be adopted, but this would require an extra source follower transistor stage at each pixel.

To overcome the problems of threshold voltage drops, the circuitry utilizes bootstrapping techniques and zero-threshold or 'native' transistors. Both of these techniques are unconventional in GaAs circuits.

In preference the processing area includes an integrated circuit embodying post-processing techniques such as correlated-double-sampling (CDS) to reduce the effects of fixed-pattern-noise. Fixed-pattern-noise arises from variations in electrical parameters (mainly pinch-off voltage) between MESFETs. Post processing also includes standard techniques to produce a television compatible image and any image processing algorithms depending on the application.

In one form of post processing an initial known signal is applied to the pixels to generate a known response from which the differences between the individual pixels can be determined. The differences are then used as correction factors to be applied during signal processing.

In a further form of the invention the imager system uses integrated optical waveguides to form ultra-high speed interconnects between circuit modules.

BRIEF DESCRIPTION OF THE DRAWINGS

For a better understanding of this invention a preferred embodiment will now be described with reference to the attached drawings in which.

DESCRIPTION OF THE PREFERRED EMBODIMENT

Figure 1:
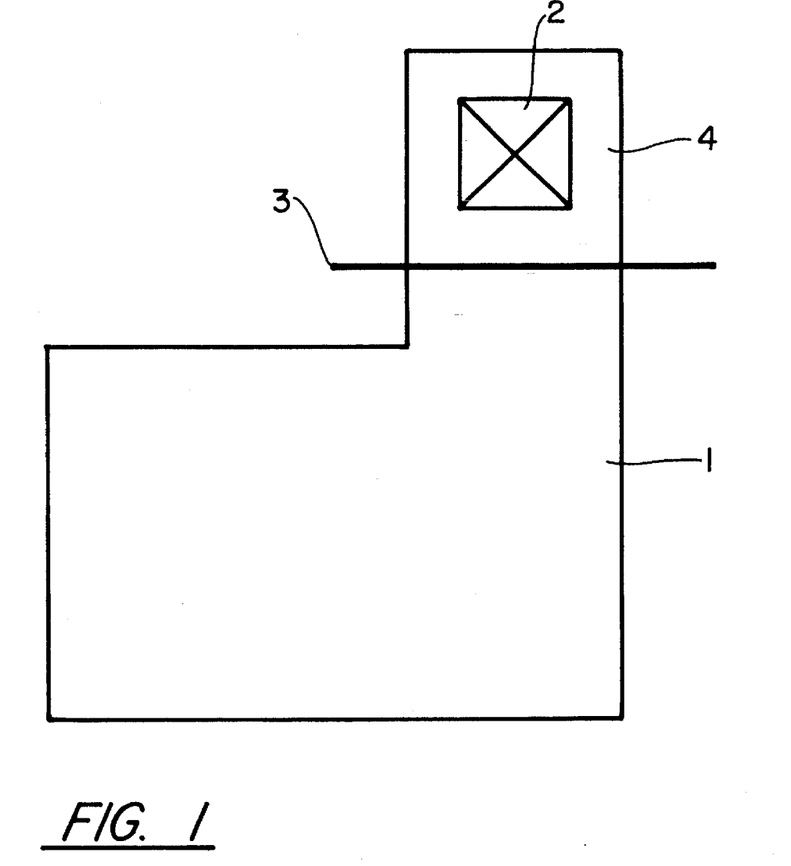
FIG. 1 shows a schematic layout of a gallium arsenide pixel design.

Referring now to the drawings in detail, there is shown in FIG. 1 a pixel which is a transistor formed on a GaAs substrate. The transistor is a MESFET with the active area 1 formed by doping with n* type species (eg. silicon). The gate of the transistor is shielded from light by a readout line (not shown here for clarity) and acts as a switch which is controlled by an address line 3 to enable/disable readout. Data is read out from the drain 4. The contact hole 2 connects the drain to the readout line.

Figure 2:
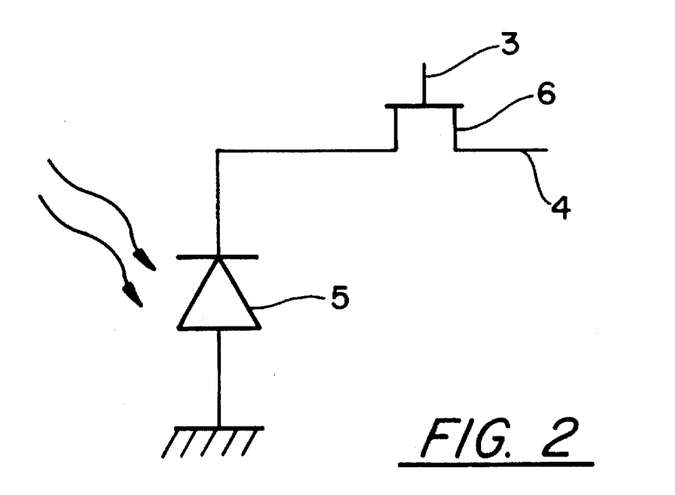
FIG. 2 shows an equivalent circuit for the pixel of FIG. 1.

An equivalent circuit is shown in FIG. 2. The pixel is equivalent to a photoresponsive diode 5 in series with a readout transistor 6.

Figure 3:
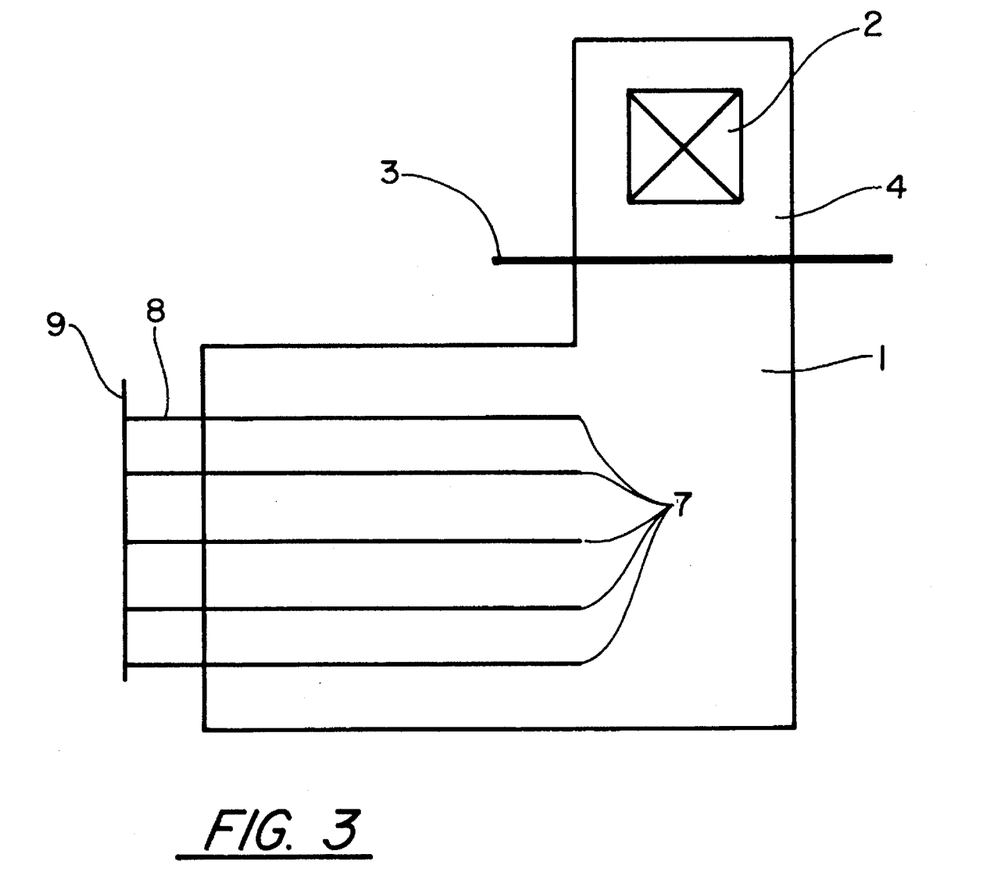
FIG. 3 shows a schematic layout of a fingered transistor pixel and an equivalent circuit.

In FIG. 3 five metal fingers 7 are shown across the active area 1. Each finger extends slightly beyond the active area as shown typically at 8. A pixel would have from thirty to fifty fingers but only five are shown here for clarity. The fingers are connected at one end by an anti-blooming line 9.

Figure 4:
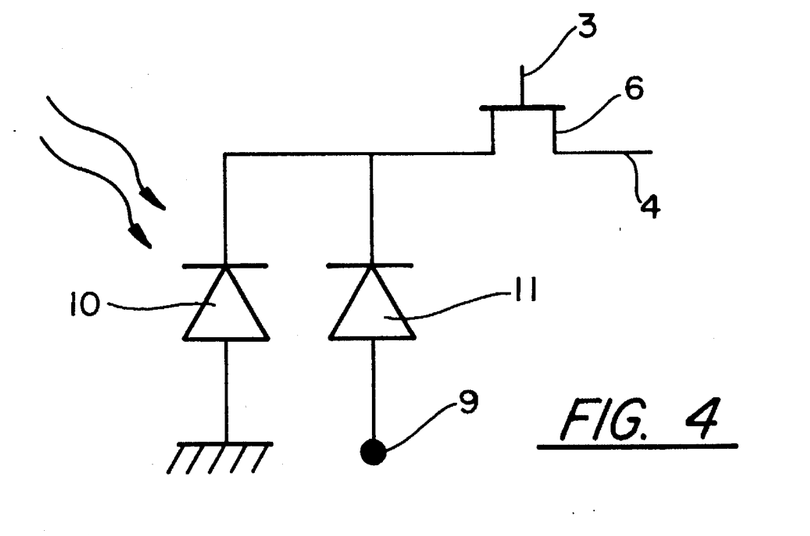
FIG. 4 shows an equivalent circuit for the pixel of FIG. 3.

The equivalent circuit is shown in FIG. 4. It is similar to FIG. 2 in that there is a readout transistor 6 in series with a photoactive element. However in this case the photoactive element is equivalent to a pair of photodiodes in parallel. There is a photodiode 10 which represents photocollection from the depletion region at the source/substrate interface and a photodiode 11 which represents the Schottky interface.

Figure 5:
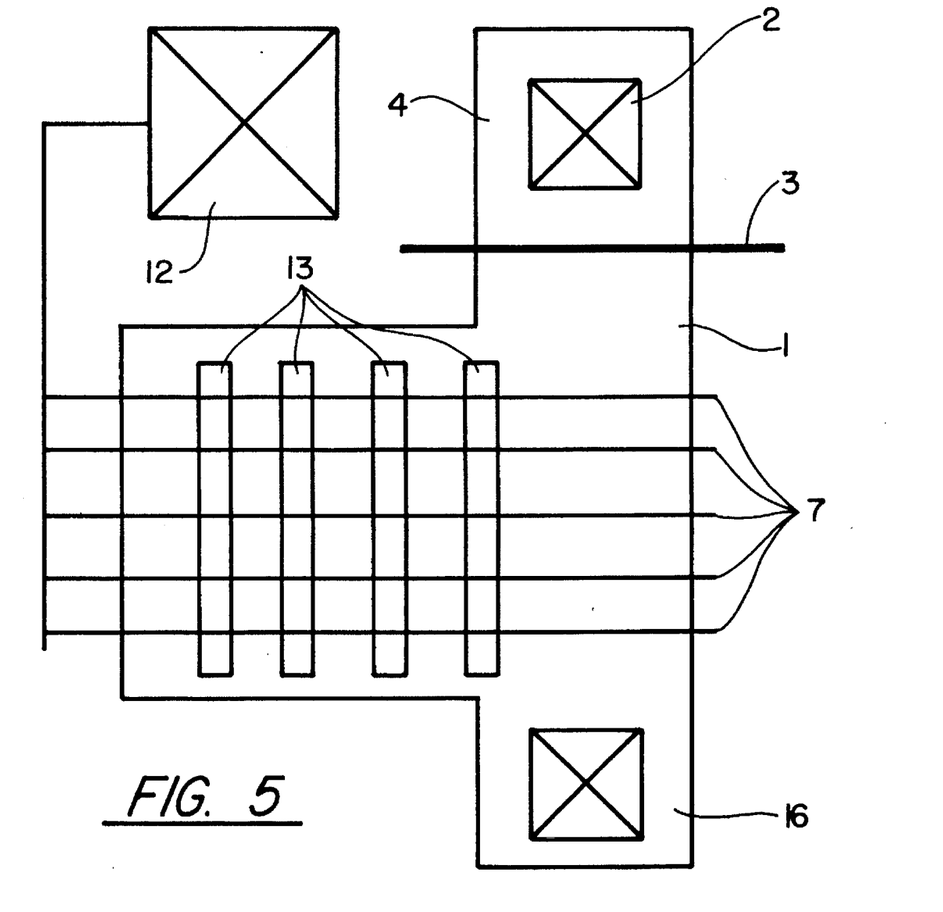
FIG. 5 shows a schematic layout of a fingered transistor dual-gate pixel with photovoltaic gate biasing and an equivalent circuit.

A pixel layout to utilize the edge effect is shown in FIG. 5. In this case the active area 1 has a number of 'cut-outs' 13 which are regions which have not been implanted with n-type species. The number of edges formed by the metal fingers 7 are thereby maximized. The figure shows four 'cut-out' regions however this number will depend on the pixel dimensions and process design rules. There is a gate resistor 14 hybridized to the imager via a bond pad 12 which is connected to the metal fingers 7. An additional ground connection is made at 16. One end of the gate resistor 14 is connected to the gate of transistor 15 and the other end is appropriately biased.

Figure 6:
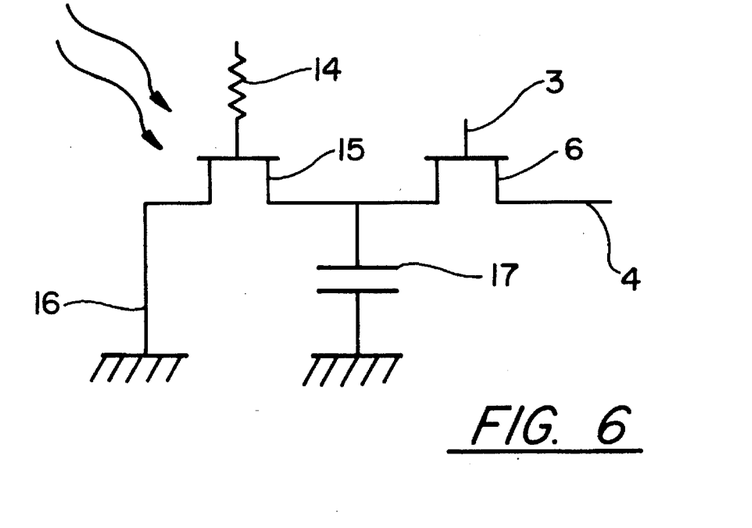
FIG. 6 shows an equivalent circuit for the pixel of FIG. 5.

The equivalent circuit is shown in FIG. 6. The photodiodes of FIG. 1 and FIG. 2 are now represented by a photoactive transistor 15 with the source 16 connected to ground and the gate connected to a gate resistor 14. Read out from the drain 4 is still enabled/disabled by an address line 3. An integration capacitance is shown at 17, however the internal capacitance of the device may be sufficient in most cases to negate the need for an explicit component.

Figure 7:
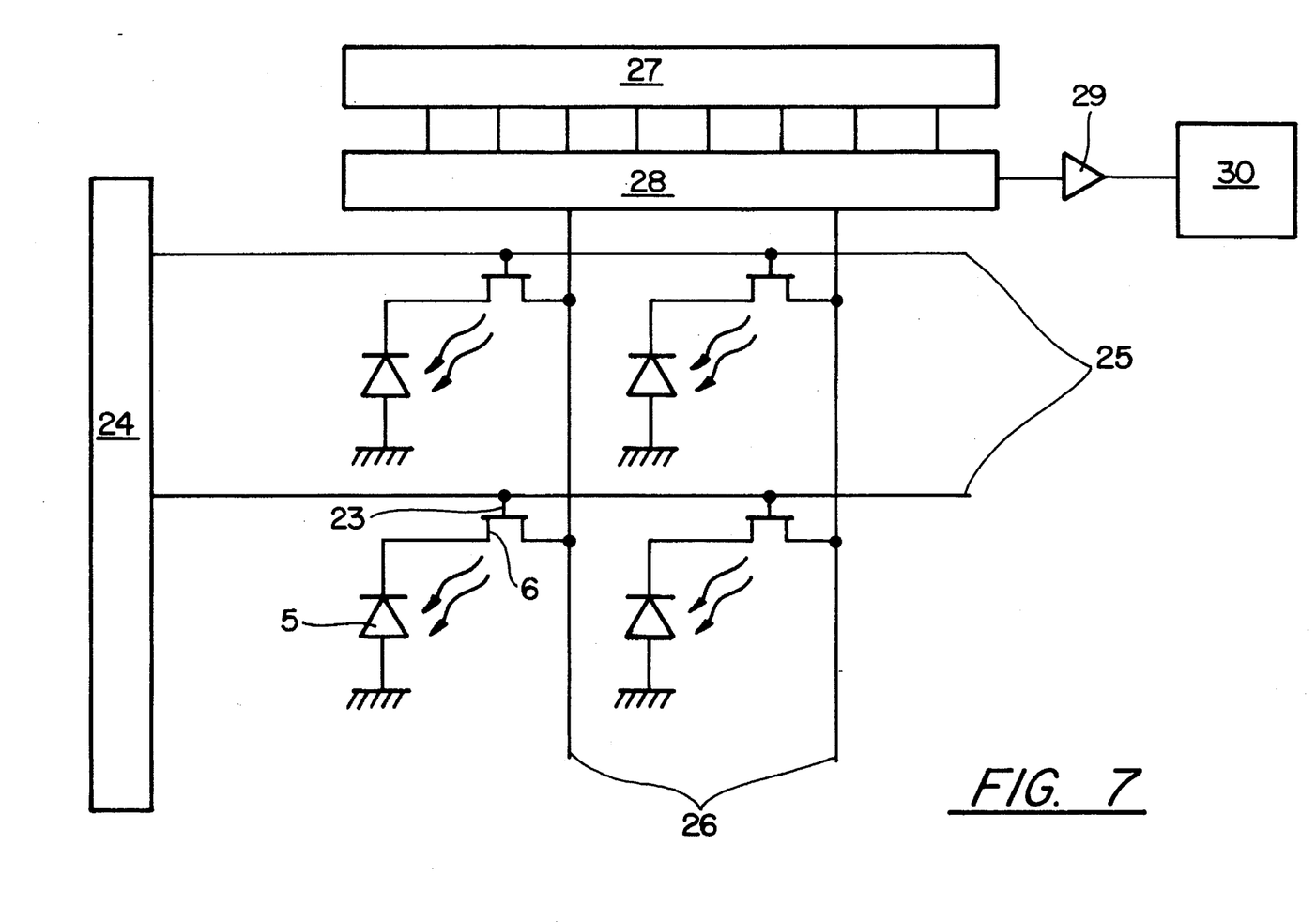
FIG. 7 shows a conventional layout of a multi-element XY array imager utilizing the pixels of FIG. 1.

FIG. 7 shows the layout of a conventional multi-element X-Y imager utilizing the pixels of FIG. 1. Typically the imager may consist of an array of 128 by 128 pixels. Each pixel consists of a photoresponsive diode 5 and a readout transistor 6. The gates (such as at 23) of the readout transistors 6 are connected to a shift register 24 which acts as a horizontal scan generator. As each address line 25 is pulsed the corresponding row of pixels is opened and the respective charges are read onto the respective column lines 26.

Another shift register 27 acts as a vertical scan generator to drive a multiplexer 28 which converts the parallel data obtained from the column lines into serial data. The serial data is output through an amplifier 29 to a signal processing area 30.

The operation of the imager is as follows:

1. The address line is pulsed to turn on the readout transistor;
2. Accumulated photocharge, in the diode (or photoactive transistor), is dumped onto the readout line by capacitive charge sharing;
3. When readout is complete the diode settles to the data bus voltage minus a threshold drop (although the threshold drop can be minimized by various techniques such as bootstrapping) and the readout transistor is turned off, leaving the diode in a reversed biased state;
4. Photons incident on the diode generate electron-hole pairs in the underlying GaAs;
5. Electron-hole pairs are separated by the field, supported by the depletion region. Electrons are swept up and accumulate on the diode's self-capacitance, causing the depletion region to contract;
6. The sequence repeats from 1.

Figure 8:
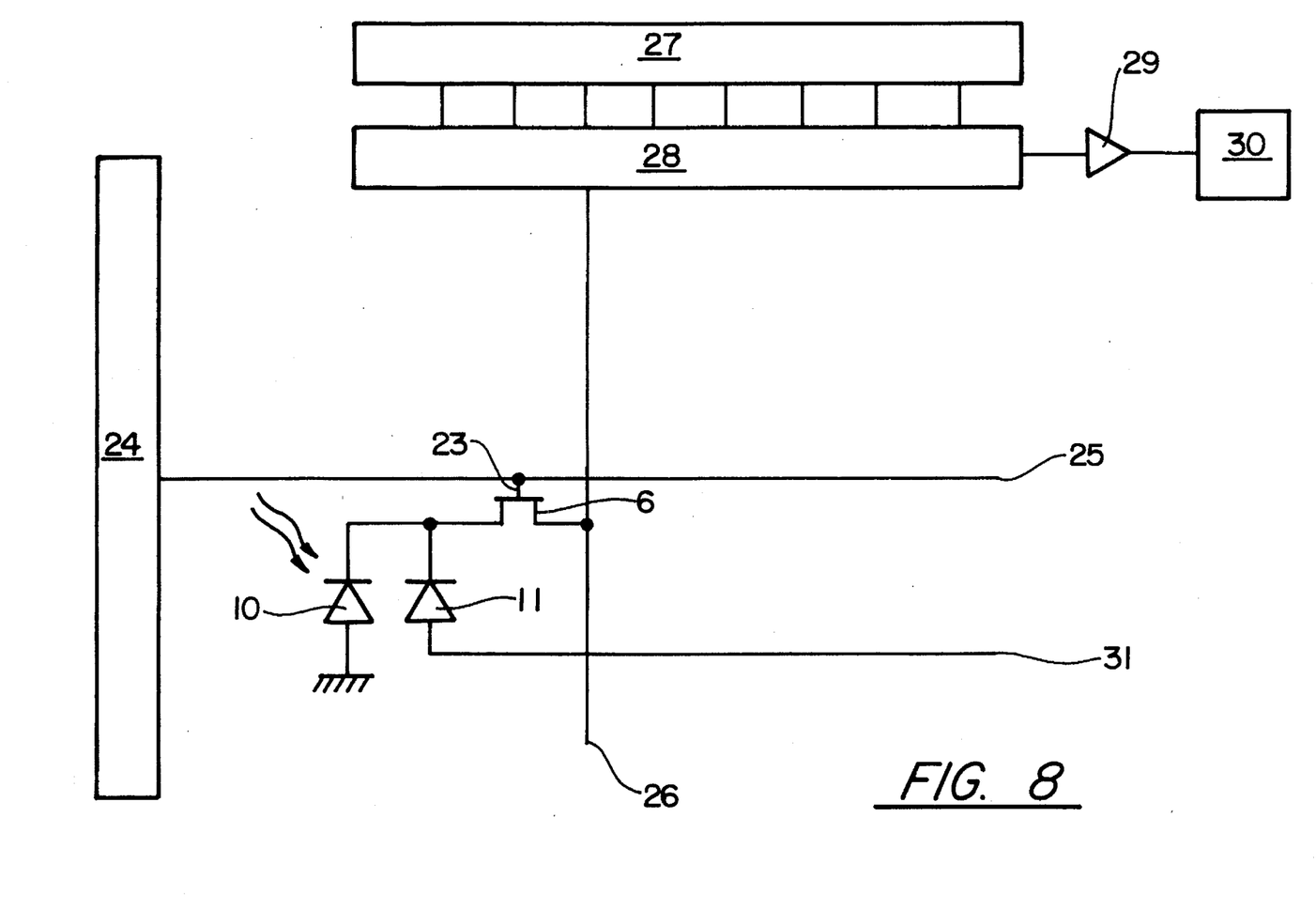
FIG. 8 shows a layout for an XY array imager utilizing the pixels of FIG. 3.

The layout for a similar device utilizing the pixel of FIG. 3 is shown in FIG. 8. In this case an additional anti-blooming line 31 is provided to bias the Schottky diode 11. In other respects the imager layout is similar to the layout of FIG. 7.

Figure 9:
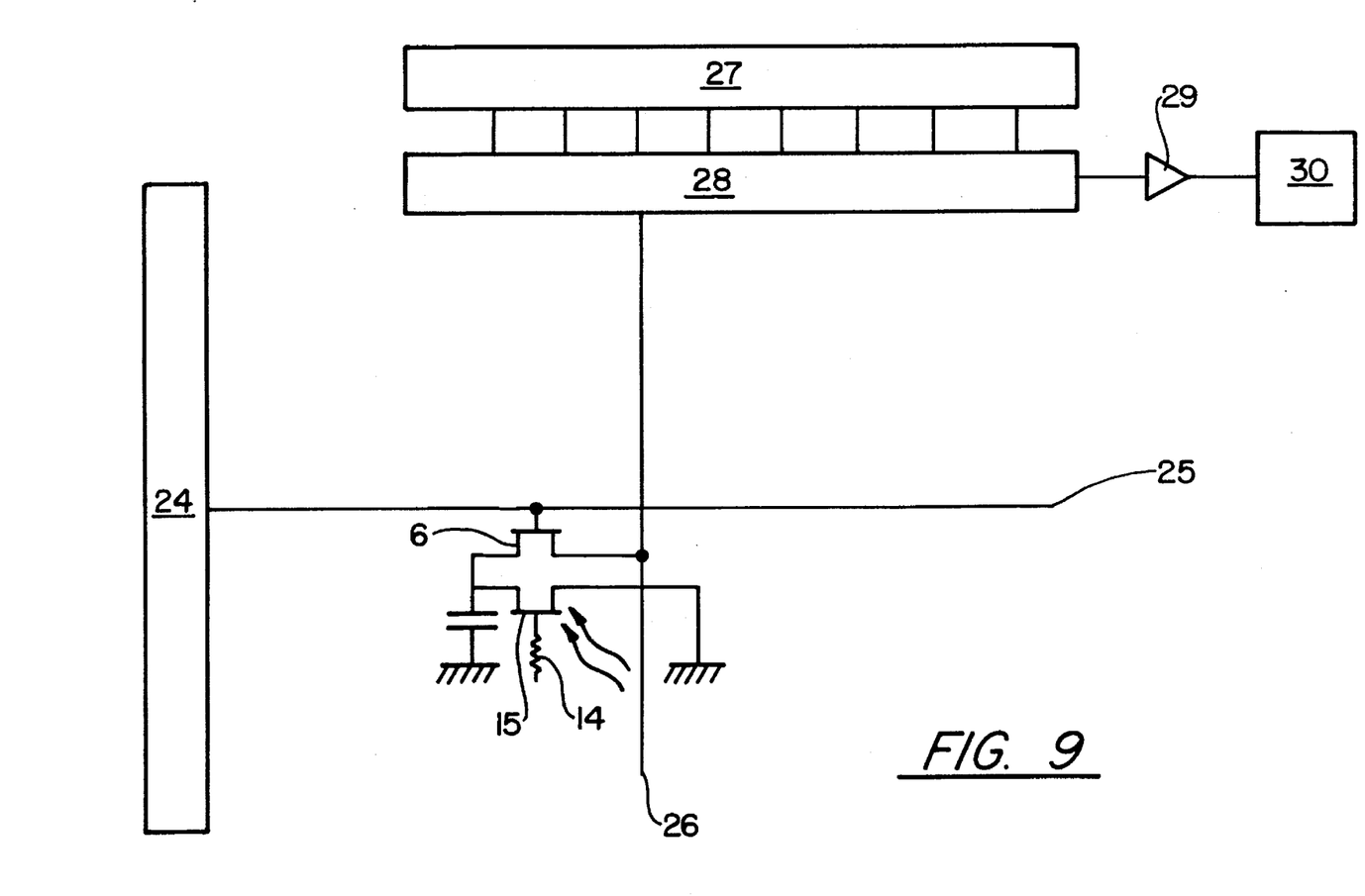
FIG. 9 shows a layout for an XY array imager utilizing the pixels of FIG. 5.

The same basic layout can be used with the pixels of FIG. 5 as shown in FIG. 9.

Figure 10:
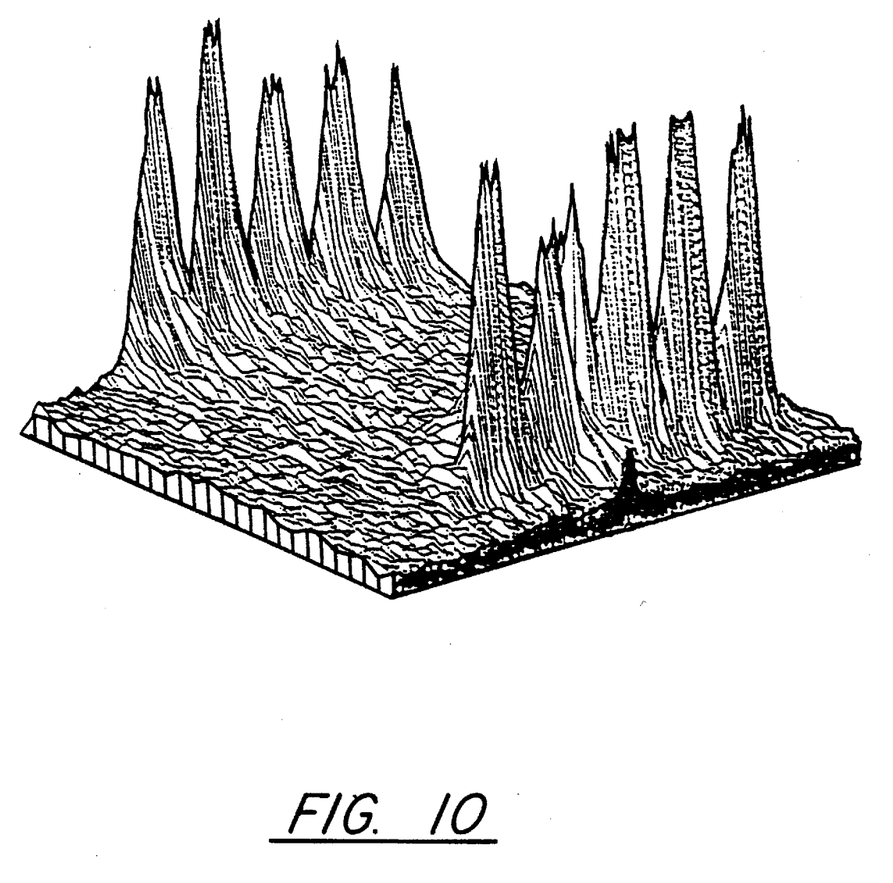
FIG. 10 shows the enhanced optical gain at the edge of the transistor.

The plot of FIG. 10 was produced by mounting a MESFET with five gate fingers on an X-Y platform and illuminating it with a 2 μm diameter CW laser spot at a wavelength of 678 nm and an incident power of 1.4 μW. The X-Y platform was controlled to move the transistor in a 2-D raster sequence and the drain current was logged so that a 3-D plot of the transistor response was generated. A 10 MΩ resistor was mounted in series with the gate.

FIG. 10 shows dramatic gain current peaks at the positions where gate metal crosses the transistor edge. The five peaks, along each edge, correspond to the five gates. In the absence of the gate resistor the drain current rolls off towards the edge of the transistor, as classically expected. The vertical axis of FIG. 10 is current and the peak current is approximately 28 mA.

In order to maximize the advantages obtainable from this effect a new MESFET layout has been designed in which the edges are maximized. This design means that there is a large number of edges in the active area and therefore more regions of enhanced gain.

It is clear that the photoresponsive device herein described provides a number of advantages over existing silicon devices. The GaAs image sensor is particularly well suited to aerospace applications. This is due primarily to the intrinsic advantages of gallium arsenide devices over silicon devices and the overall size reductions achievable with single chip integrated devices.

It will be apparent to those skilled in the art that various modifications could be made to the particular embodiment described in this specification. The embodiment is for illustrative purposes and is not definitive of the invention. Throughout the specification reference to a pixel is taken to include a single element used as a discrete photodiode.

Throughout this specification the purpose has been to illustrate the invention and not to limit this.

We claim:

1. A pixel comprising a Field Effect Transistor formed on a gallium arsenide substrate wherein a source of the Field Effect Transistor is a photoresponsive element, a gate of the Field Effect Transistor is shielded from light and acts as a switch to enable/disable readout and a drain of the Field Effect Transistor is connected to a readout line.

2. The pixel of claim 1 further including an address line connected to the gate of the Field Effect Transistor and a data line connected to the drain of the Field Effect Transistor said address line being adapted to enable/disable readout of data from the drain on the data line.

3. A pixel comprised of a Field Effect Transistor formed on a gallium arsenide substrate wherein a source of the Field Effect Transistor is a photoresponsive element, a gate of the Field Effect Transistor is shielded from light and acts as a switch to enable/disable readout, a drain of the Field Effect Transistor is connected to a readout line and wherein there are a plurality of fingers across the source, each finger extending beyond the source and said source accumulating charge when exposed to light.

4. The pixel of claim 3 wherein the plurality of fingers are connected at one end by an anti-blooming bias line.

5. The pixel of claim 3 further including an address line connected to the gate of the Field Effect Transistor said address line being adapted to enable/disable readout of data from the drain on the readout line.

6. A pixel as in claim 3 wherein the Field Effect Transistor is a MESFET and the plurality of fingers are formed of metal.

7. The pixel of claim 6 wherein the plurality of metal fingers lie across the source thereby forming a Schottky diode.

8. The pixel of claim 6 wherein said metal fingers are made from the same material as the gate of the MESFET.

9. The pixel of claim 6 further including a gate resistor connected in series with the gate of the MESFET.

10. A pixel comprising a photoactive transistor formed on a gallium arsenide substrate in which a source of the photoactive transistor is grounded and a plurality of metal fingers lie across the source, said source and said plurality of metal fingers being arranged to maximize the number of locations where the fingers cross a transistor boundary, said fingers forming the gate of the photoactive transistor.

11. The pixel of claim 10 further including a gate resistor connected in series with the gate of the photoactive transistor.

12. The pixel of claim 10 wherein the gate resistor has a value in the range 1 M$\Omega$ to 10 M$\Omega$.

13. An X-Y imager formed on a gallium arsenide substrate in which there is a photoactive area consisting of a plurality of pixels, each pixel comprising a Field Effect Transistor formed on a gallium arsenide substrate in which the source of the Field Effect Transistor is a photoresponsive element, the gate of the Field Effect Transistor is shielded from light and acts as a switch to enable/disable readout and the drain of the Field Effect Transistor is connected to a readout line and in which image processing is conducted in a processing area comprised of a plurality of integrated circuits.

14. The X-Y imager of claim 13 in which the plurality of integrated circuits are formed in gallium arsenide.

15. The X-Y imager of claim 13 in which a plurality of fingers lie across the source, each finger extending beyond the source, said source accumulating charge when exposed to light.

16. The X-Y imager of claim 15 wherein the Field Effect Transistor is a MESFET and the plurality of fingers are formed of metal.

17. The X-Y imager of claim 16 wherein the metal fingers are laid out to maximize the number of locations where the fingers cross a transistor boundary.

18. The X-Y imager of claim 13 wherein the pixels are addressable by a circuit which uses one shift register or decoder to address a series of paths that control the pixel enable/disable gates and a second shift register or decoder is used to address a multiplexer that converts parallel data obtained from the readout lines into a serial stream.

19. The X-Y imager of claim 13 wherein a charge sensing technique is adopted for image readout in which charge is transferred from a pixel to a readout line and from readout line to an output bus by a process of capacitive charge sharing.

20. The X-Y imager of claim 13 wherein the processing area includes an integrated circuit embodying post-processing techniques such as correlated-double-sampling (CDS) to reduce the effects of fixed-pattern-noise.

21. The X-Y imager of claim 20 wherein an initial known signal is applied to the pixels to generate a known response from which the differences between the individual pixels can be determined.

22. The X-Y imager of claim 13 wherein integrated optical waveguides are used to form ultra-high speed interconnects between pixels and within the processing area.

23. A gallium arsenide image sensor comprising a gallium arsenide photoresponsive array and a gallium arsenide image processor, said sensor being fabricated in a conventional gallium arsenide digital IC process thereby permitting very large scale integration.

\* \* \* \* \*